(12) United States Patent
Moreira (10) Patent No.: US 8,816,769 B2
(45) Date of Patent: Aug. 26, 2014

(54) DIFFERENTIAL STACKED OUTPUT STAGE FOR POWER AMPLIFIERS

(75) Inventor: José Moreira, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 53 days.

(21) Appl. No.: 13/562,521

(22) Filed: Jul. 31, 2012

(65) Prior Publication Data
US 2014/0035669 A1    Feb. 6, 2014

(51) Int. Cl.
*H03F 3/45*        (2006.01)

(52) U.S. Cl.
CPC ........................................ *H03F 3/45* (2013.01)
USPC ............................ 330/253; 330/258; 330/311

(58) Field of Classification Search
CPC .......................................................... H03F 3/45
USPC .......................................................... 330/253
See application file for complete search history.

(56) References Cited

U.S. PATENT DOCUMENTS

| | | | |
|---|---|---|---|
| 6,653,898 B2 | 11/2003 | Monroe | |
| 8,013,676 B2 | 9/2011 | Su et al. | |
| 8,463,226 B2 * | 6/2013 | Yu et al. | ........................ 455/334 |

OTHER PUBLICATIONS

Leuschner, Stephan, et al.; "A 31-dBm, High Ruggedness Power Amplifier in 65-nm Standard CMOS with High-Efficiency Stacked-Cascode Stages", 2010 IEEE Radio Frequency Integrated Circuits Symposium, p. 395-398.
Sowlati, Tirdad, et al.; "A 2.4-GHz 0.18-um CMOS Self-Biased Cascade Power Amplifier", IEEE Journal of Solid-State Circuits, vol. 38, No. 8, Aug. 2003, p. 1318-1324.

* cited by examiner

*Primary Examiner* — Robert Pascal
*Assistant Examiner* — Khiem Nguyen
(74) *Attorney, Agent, or Firm* — Eschweiler & Associates, LLC (57) ABSTRACT

A power amplifier system includes a transistor stack and an upper portion. The upper portion includes an LC tank. The LC tank is configured to generate selected harmonics to mitigate voltage stress and facilitate amplifier efficiency. The transistor stack includes serial connected input transistors and upper transistors. The input transistors are configured to receive an input signal and the upper transistors are configured to provide an amplifier output signal. The LC tank is configured to provide the selected harmonics to at least gates of the upper transistors.

22 Claims, 11 Drawing Sheets

DIFFERENTIAL STACKED OUTPUT STAGE FOR POWER AMPLIFIERS

BACKGROUND

A power amplifier is a device that increases the power of an input signal. Power amplifiers are used in many circuits, communication systems, electronic device, and the like.

Power amplifiers have a variety of properties associated with their behavior. These properties include gain, efficiency, output power, bandwidth, linearity, stability, dynamic range and the like. Over time, these properties can vary or degrade from their original values.

DETAILED DESCRIPTION

Methods and systems are disclosed that mitigate or control stresses on individual transistors of power amplifiers. The stresses include applied voltage values and voltage swings seen by individual transistors of power amplifiers. The systems and methods selectively introduce harmonics that control and/or share the stresses.

Some of the key parameters for power amplifiers are their ability to maintain selected or desired characteristics without altering due to voltage stress, such as applied voltages and voltage swings. Stressing or over stressing transistors can cause transistor operating characteristics to degrade or fail over time. Thus, an amplifier specification may include that output power is to be achieved without overstressing the transistors so that their characteristics remain relatively stable over a product's lifetime. Additional, the specification also typically requires a specified efficiency, which is the ratio of output power to power consumption. Otherwise, not meeting the specified efficiency leads to high power consumption. Some negative effects of high power consumption are low battery autonomy and substantial self heating of the power amplifier.

The design of integrated power amplifiers in standard CMOS technologies is particularly challenging. For example, deliver of 1 W to a 50 ohm load means that the voltage swing at the load will be 20 Vpp, when assuming a sine wave. However, the transistors typically used can only withstand a few Volts. Thus, the power amplifier is designed to utilize a lower voltage over the transistors than is used over the load.

Various techniques exist to mitigate voltage stress or over voltage stress on transistors in power amplifiers. One technique is to utilize an impedance matching network between an output stage and a load. By utilizing an adequate impedance transformation ratio, a maximum voltage at an output stage can be maintained lower than at the load so that the transistors are not over voltage stressed. However, a matching network with a high impedance transformation ratio typically has high losses, which leads to relatively low efficiency. Furthermore, the choice of the transformation ratio may also be determined by other factors, such as ensuring the maximum power transfer to the load at a given supply voltage.

Another technique used is to use a stack of transistors instead of a single transistor. Thus, if a stack of transistors is used, the maximum voltage over each transistor is generally much lower than the maximum voltage at the output of the stage. Typically, a transistor positioned at a bottom of the stack is connected in common-source. The other transistors in the stack can be connected in common-gate. To obtain a suitable distribution of the voltage stress over the stacked transistors, the common-gate connects are often degenerated, which means that the gate voltages are not at a fixed potential, but are made signal dependent. Normally, the gate voltages increase when an output voltage increases and decrease when the output voltage decreases. Thus, when the stack is conducting (high current, low output voltage) the gate voltages are relatively low, which leads to relatively high ON resistance of the output stack. Thus, relatively high power losses and low efficiency is the result.

The inventors of the present invention recognize that differential power amplifiers include common mode and the differential mode paths and that these paths are not necessarily identical. One ore more embodiments of the invention utilize even order harmonics, present only in the common-mode path, to mitigate voltage stress while keeping the ON resistance of the stack low.

Figure 1:
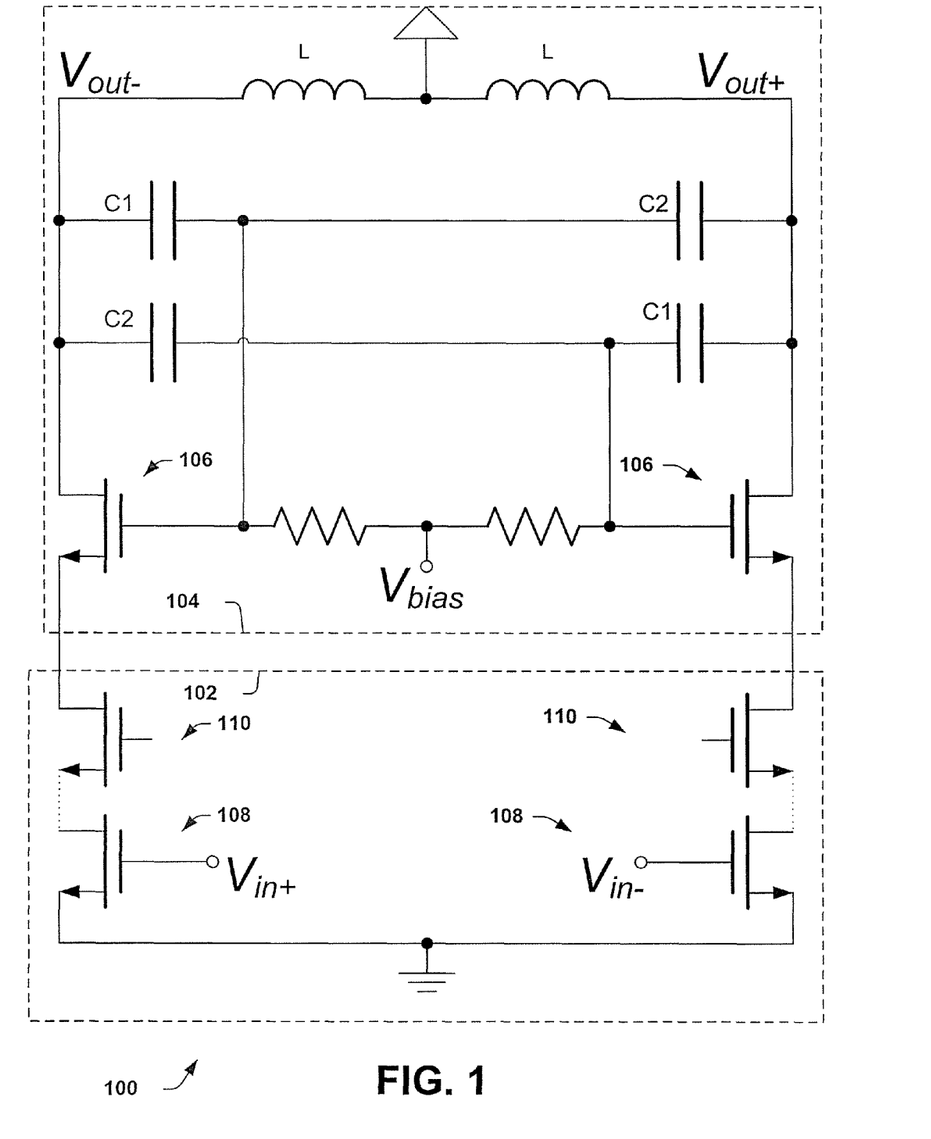
FIG. 1 is a diagram illustrating a power amplifier system utilizing even order harmonics to mitigate voltage stress.

FIG. 1 is a diagram illustrating a power amplifier system 100 having a transistor stack and utilizing selected harmonics to mitigate voltage stress. The system 100 includes a transistor stack 102, a lower portion 102 and an upper portion 104. The system 100 utilizes even harmonics to mitigate individual transistor voltage stresses, mitigate power losses and obtain suitable efficiency.

The lower portion 102 includes at least a portion of the transistor stack and receives an input signal. The upper portion 104 an LC tank and upper transistors 106 and is configured to provide a power amplifier output signal.

The transistor stack includes one or more transistors connected in series. The stack includes input or lower transistors 108, one or more gate connected transistors 110, and can also include the upper transistors 106, also referred to as output transistors. The stack is configured to receive a differential input signal designated by $V_{in+}$ and $V_{in-}$ through the input transistors 108.

The upper portion 104 is supplied with a bias voltage $V_{bias}$ and a supply voltage and provides the power amplifier output designated by $V_{out+}$ and $V_{out-}$, which is a differential output signal. The power amplifier output is provided with a suitable efficiency and without overstressing the transistors of the transistor stack.

The LC tank of the upper portion 104 includes inductors L and capacitors C1 and C2. The LC tank is configured or dimensioned to resonate at a frequency of a fundamental harmonic for differential signals and at a frequency of an even order (typically or normally second order) harmonic for common mode signals, since the capacitors C1 and C2 are connected differentially. The harmonics, referred to as selected harmonics, are fed to gates of at least a portion of the transistor stack to mitigate voltage stress on individual transistors of the system 100. In one example, the selected harmonics are fed to gates of at least some of the gate connected transistors 106 and 110 of the transistor stack.

The selected harmonics comprise or include even order harmonic(s), such as the second order harmonic. The gate voltages of the gate connected transistors are dependant on common mode signals, which are the even order harmonics. Thus, the gate voltages of the gate connected transistors can be adjusted or altered by feeding the even order harmonics to those gates. The gate voltages of the gate connected transistors are ideally independent of the differential signals. As a result, the gate voltages of the gate connected transistors of the stack are relatively high during both positive and negative peaks of the output voltage and relatively low during rising and falling transitions. As a result, when high current flows through the transistor stack, the gate voltages are relatively high, which leads to relatively low ON resistance of the output stage. This leads to relatively low power losses and relatively high efficiency. The relatively low gate voltages during the transitions do not have a substantial impact on efficiency.

In contrast, the conventional technique described above of unselectively feeding all the frequency components of the output voltage to the transistor gates leads to low gate voltages for the stack when the stack is conducting (high current, low output voltage). This results in a relatively high ON resistance, which leads to relatively higher power losses and lower efficiency. Additionally, another conventional technique described above uses only an impedance matching network. However, the impedance matching network typically has high losses, which leads to a relatively lower power efficiency.

Figure 2:
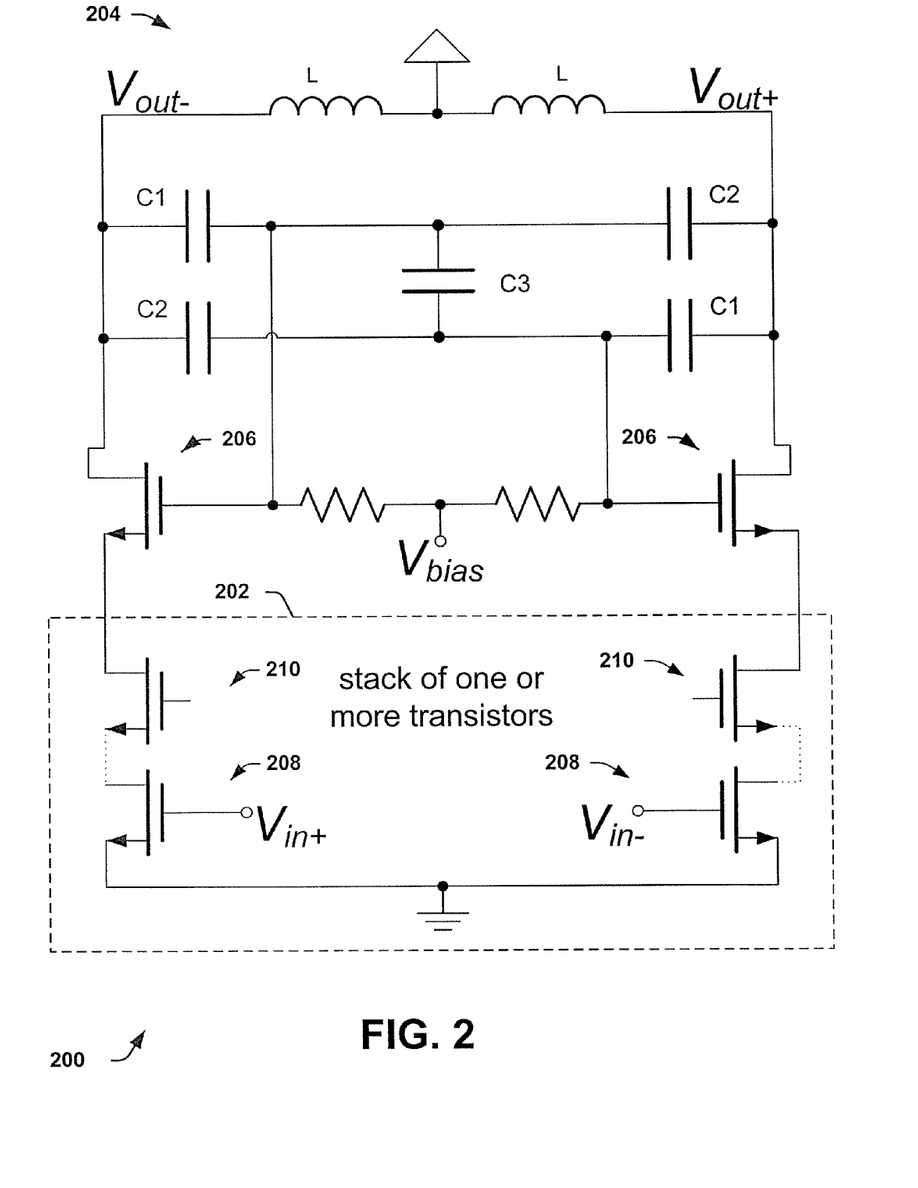
FIG. 2 is a diagram illustrating a power amplifier system utilizing even order harmonics to mitigate voltage stress.

FIG. 2 is a diagram illustrating a power amplifier system 200 that utilizes selected harmonics to mitigate voltage stress. The system 200 includes a lower portion 202 and an upper portion 204. The system 200 utilizes even order harmonics to mitigate individual transistor voltage stresses, mitigate power losses and obtain suitable efficiency.

The system 200 includes a transistor stack having one or more transistors connected in series as shown. The stack includes input transistors 208, one or more gate transistors 210 and can include the output or upper transistors 206. The stack is configured to receive a differential input signal designated by $V_{in+}$ and $V_{in-}$ by way of the input transistors 208

The upper portion 204 includes upper transistors 206 and an LC circuit or tank. The upper portion 204 is configured to provide a differential output signal designated by $V_{out+}$ and $V_{out-}$, referred to as a power amplifier output. The upper portion 204 is also configured to receive a bias voltage $V_{bias}$ and a supply voltage. The power amplifier output is provided with a suitable efficiency and mitigates stress to the transistors of the system 200.

The LC tank is shown with a suitable configuration for the LC tank that provides selected harmonics that include an even order harmonic. It is appreciated that alternate configurations are contemplated and in accordance with the invention.

The LC tank includes capacitors as shown and designated by C1, C2, and C3. The values for C1, C2, and C3 can be selected to obtain selected harmonics to mitigate voltage stress on the transistors of the system 200. If C1 is selected to be greater than C2, odd order harmonics, including a fundamental harmonic, are fed to gates of the upper transistors 206. This can decrease efficiency, but may be needed to decrease the voltage stress on these transistors when the stack 102 is OFF. Part of the voltage stress is then transferred to the other transistors in the stack. If C1 is selected to be equal to C2, only even order harmonics can be fed through the capacitors; odd-order harmonics can only be fed through the parasitic transistor capacitances.

Selecting C1 to be less than C2 allows canceling of the gate to drain capacitance (Cgd). If C1 added to Cgd is equal to C2, odd order harmonics can still be provided to the gates of the upper transistors 206 through gate to source capacitances. This effect can be canceled out by selecting the sum of C1 and Cgd to be less than C2, however instability can be encountered due to positive feedback of the differential signal.

Capacitor C3 permits further control of the differential gate voltage switch, including odd order harmonics, without significantly affecting the resonance of the LC tank of the upper portion 204.

The power amplifier system 200 includes a common mode path and a differential mode path, which are varied. The common mode path and the differential mode path are designed with different transfer functions in order to distribute the voltage stress over the stack without compromising efficiency. As shown above, setting C1 equal to C2 feeds substantially even harmonics to the gates of the upper transistors via the common mode path. Thus, voltage stress can be mitigated while keeping the ON resistance of the stack relatively low. Additional details of the common and differential mode paths are provided below.

Figure 3:
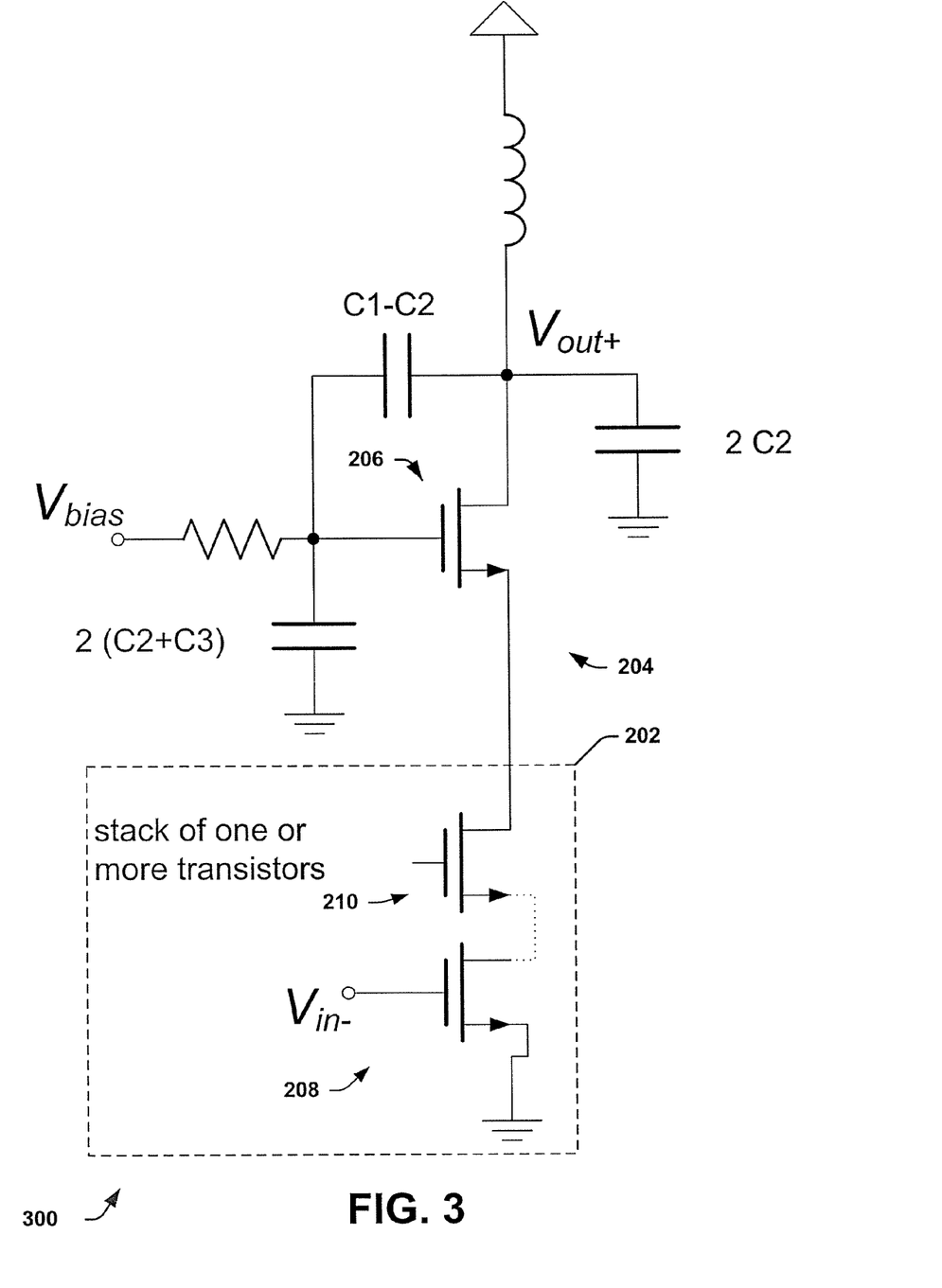
FIG. 3 is a circuit diagram illustrating an equivalent circuit for a differential mode path for the power amplifier system.

FIG. 3 is a circuit diagram illustrating an equivalent circuit 300 for a differential mode path for the power amplifier system 200. The circuit 300 is an equivalent circuit of system 200 for a differential signal path. Additional descriptions for similarly named components can be referenced above in the description of the power amplifier system 200.

The circuit 300 includes the lower portion 202 and the upper portion 204. The lower portion includes a transistor stack that receives half of the differential input signal $V_{in}$ at an input transistor 208. The transistor stack also includes one or more gate connected transistors 210. The stack can also include an upper transistor 206.

The upper portion 204 includes the upper transistor 206 and an LC tank. The upper portion is configured to provide a portion of a power amplifier output $V_{out+}$ through the upper transistor 206. Additionally, the upper portion 204 is configured to receive a bias voltage $V_{bias}$ and a supply voltage.

If transistor capacitances are neglected, the gate voltage of the upper transistor 206 follows the output voltage (drain) in a ratio of $(C1-C2)/(C1+C2+2C3)$. The transfer function for the differential mode path feeds odd order harmonics (including the fundamental harmonic) to the gate of the upper transistor 206.

Figure 4:
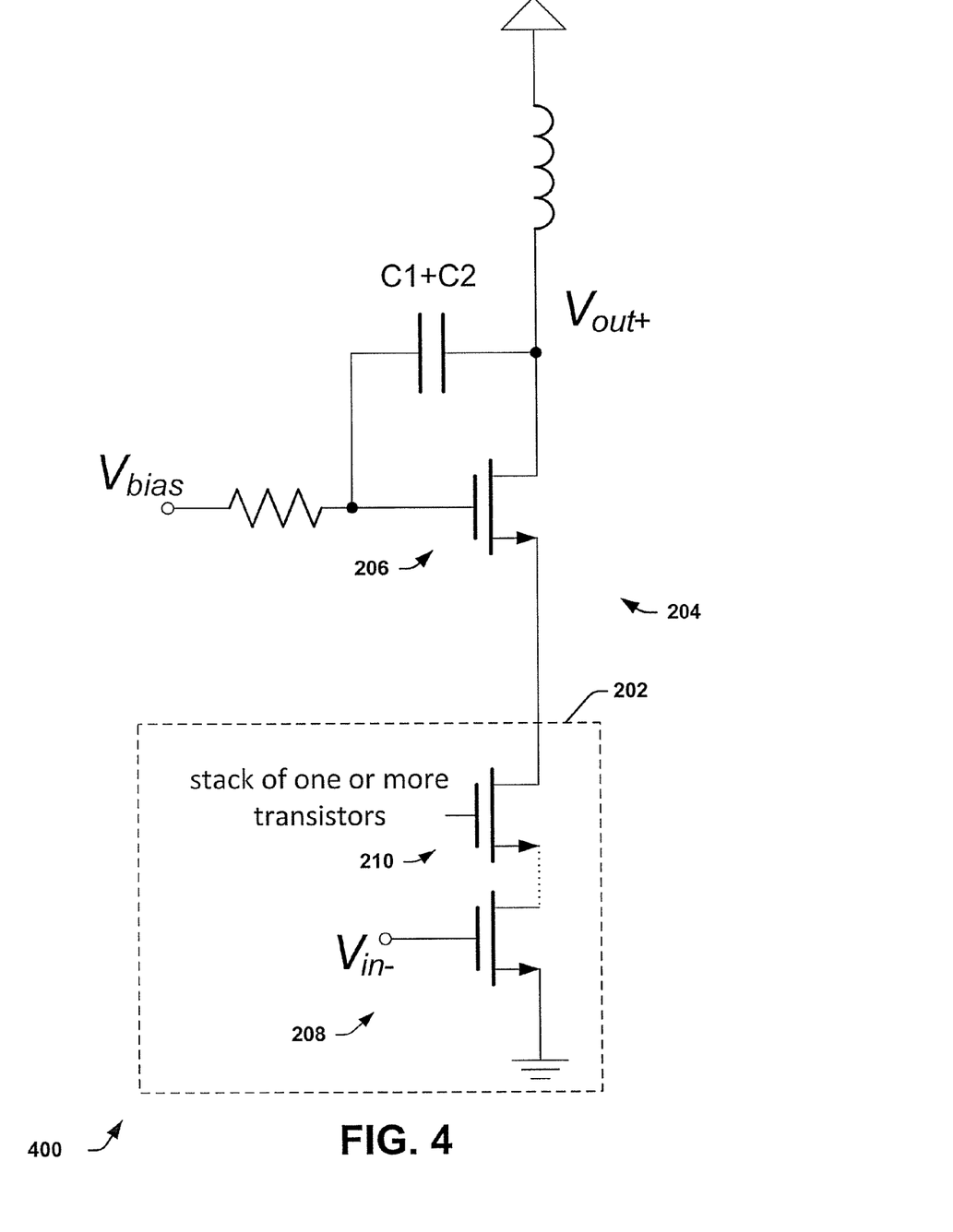
FIG. 4 is a circuit diagram illustrating an equivalent circuit for a common mode path for the power amplifier system.

FIG. 4 is a circuit diagram illustrating an equivalent circuit 400 for a common mode path for the power amplifier system 200. The equivalent circuit 400 depicts a common mode signal path. Additional descriptions for similarly named components can be referenced above in the description of the power amplifier system 200.

The circuit 400 includes a lower portion 202 and an upper portion 204. The lower portion includes a transistor stack, which includes an input transistor 208 and one or more serial gate connected transistors 210. The stack can also include an upper transistor 206. The input transistor 208 receives a portion of the input signal V.

The upper portion 204 includes the upper transistor 206 and is configured to provide the common-mode component of the output signal $V_{out}$. It can be seen that the upper transistor 206 is diode-connected for RF signals and its gate voltage floats with the output (drain).

FIGS. 3 and 4 are provided to facilitate an understanding of the arrangement of the capacitors C1, C2, and C3 and the differential and common mode paths and resulting transfer functions for the amplifier system 200.

Figure 5:
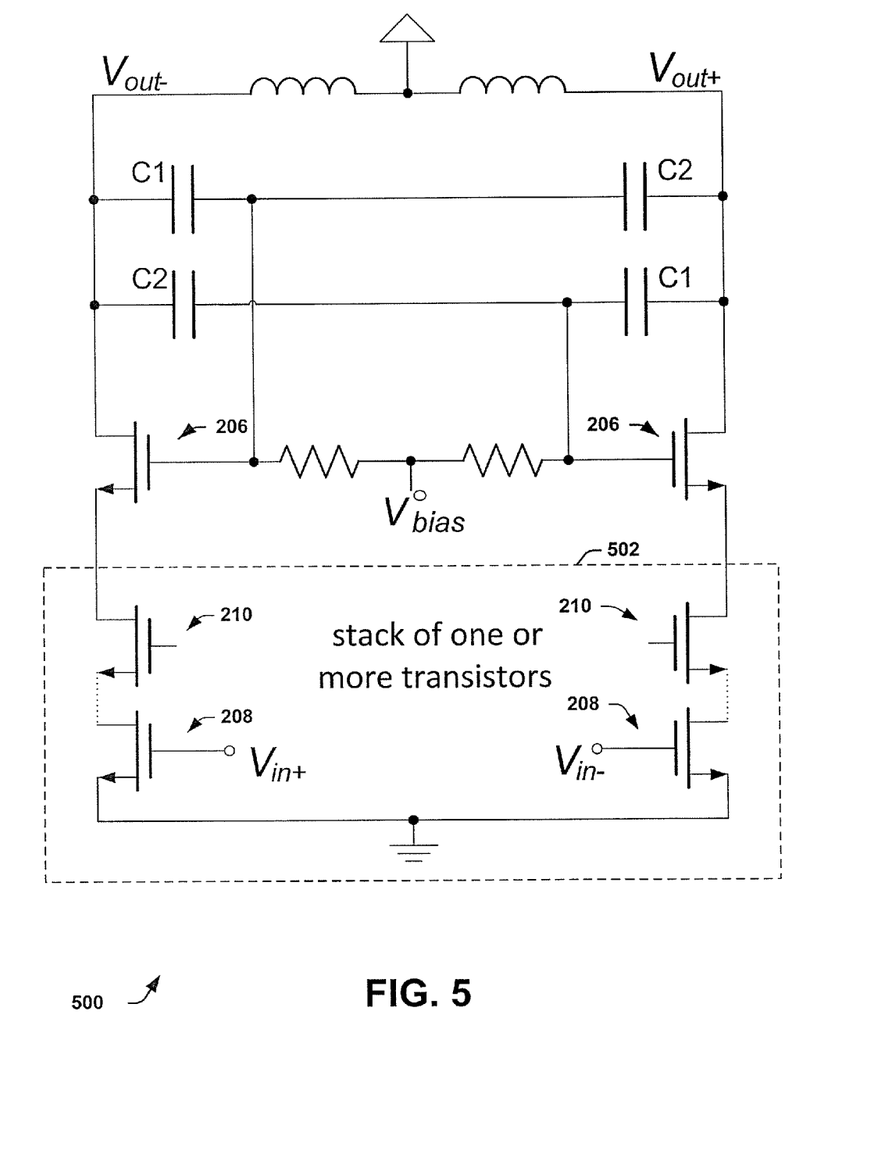
FIG. 5 is a diagram illustrating a power amplifier system with a selected capacitance value for an LC tank.

FIG. 5 is a diagram illustrating a power amplifier system 500. The system 500 includes a lower portion 502 and an upper portion 504. The system 500 is a particular case of system 200, described above, wherein C3=0. As a result, FIG. 2 and system 200 can be referenced to facilitate understanding and for additional description.

The lower portion 502 includes input transistors 208 and one or more gate connected transistors 210. The input transistors 208 are configured to receive an input signal, designated as $V_{in+}$ and $V_{in-}$. A transistor stack includes the input transistors 208 and the one or more gate connected transistors 210 and is configured to provide a stack output at a drain of a last transistor of the one or more gate connected transistors 210.

The upper portion 504 includes upper transistors 206 and an LC tank. The upper transistors 206 are configured to provide a power amplifier output, designated by $V_{out+}$ and $V_{out-}$. The LC tank includes pairs of capacitors C1 and C2.

Figure 6:
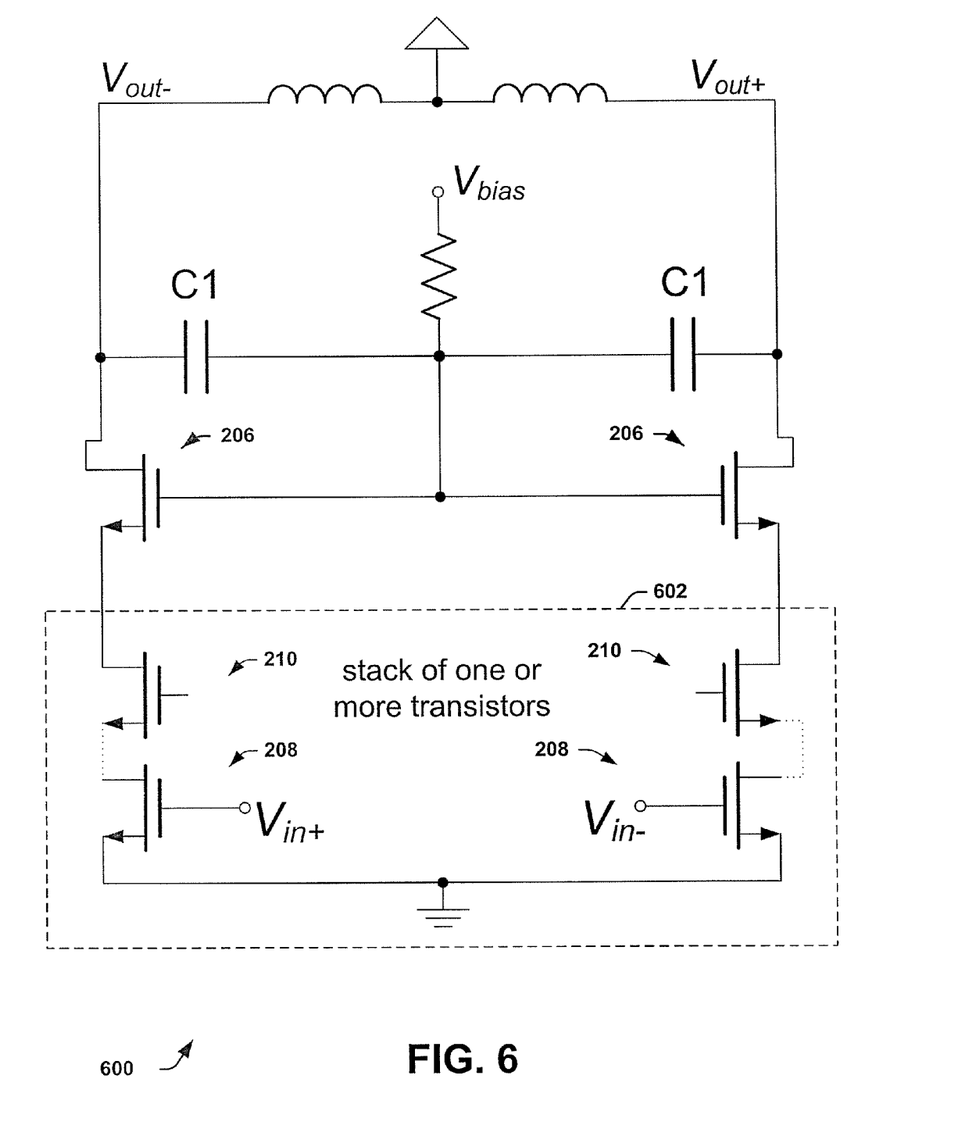
FIG. 6 is a diagram illustrating a power amplifier system with another selected capacitance value for an LC tank.

FIG. 6 is a diagram illustrating a power amplifier system 600. The system 600 includes a lower portion 602 and an upper portion 604. The system 600 is a particular case of system 200, described above, wherein C3=infinity. As a result, FIG. 2 and system 200 can be referenced to facilitate understanding and for additional description.

The lower portion 602 includes input transistors 208 and one or more gate connected transistors 210. The input transistors 208 are configured to receive an input signal, designated as $V_{in+}$ and $V_{in-}$. A transistor stack includes the input transistors 208 and the one or more gate connected transistors 210 and is configured to provide a stack output at a drain of a last transistor of the one or more gate connected transistors 210.

The upper portion 604 includes upper transistors 206 and an LC tank. The upper transistors 206 are configured to provide a power amplifier output, designated by $V_{out+}$ and $V_{out-}$. The LC tank here only includes a pair of capacitors C1.

With C3 set to infinity, C1 and C2 of FIG. 2 are connected in parallel; they can be combined into a single capacitor C1, which value is the sum of the original C1 and C2 values.

It is noted that capacitors can be added between the output nodes of the amplifier system (e.g., 200) and RF ground in order to tune the resonance frequencies of both the differential and the common-mode paths. Additionally, capacitors can be added between the gates of the upper transistors of the stack and RF ground, in order to decrease both the differential and the common-mode gate voltage swing.

Figure 7:
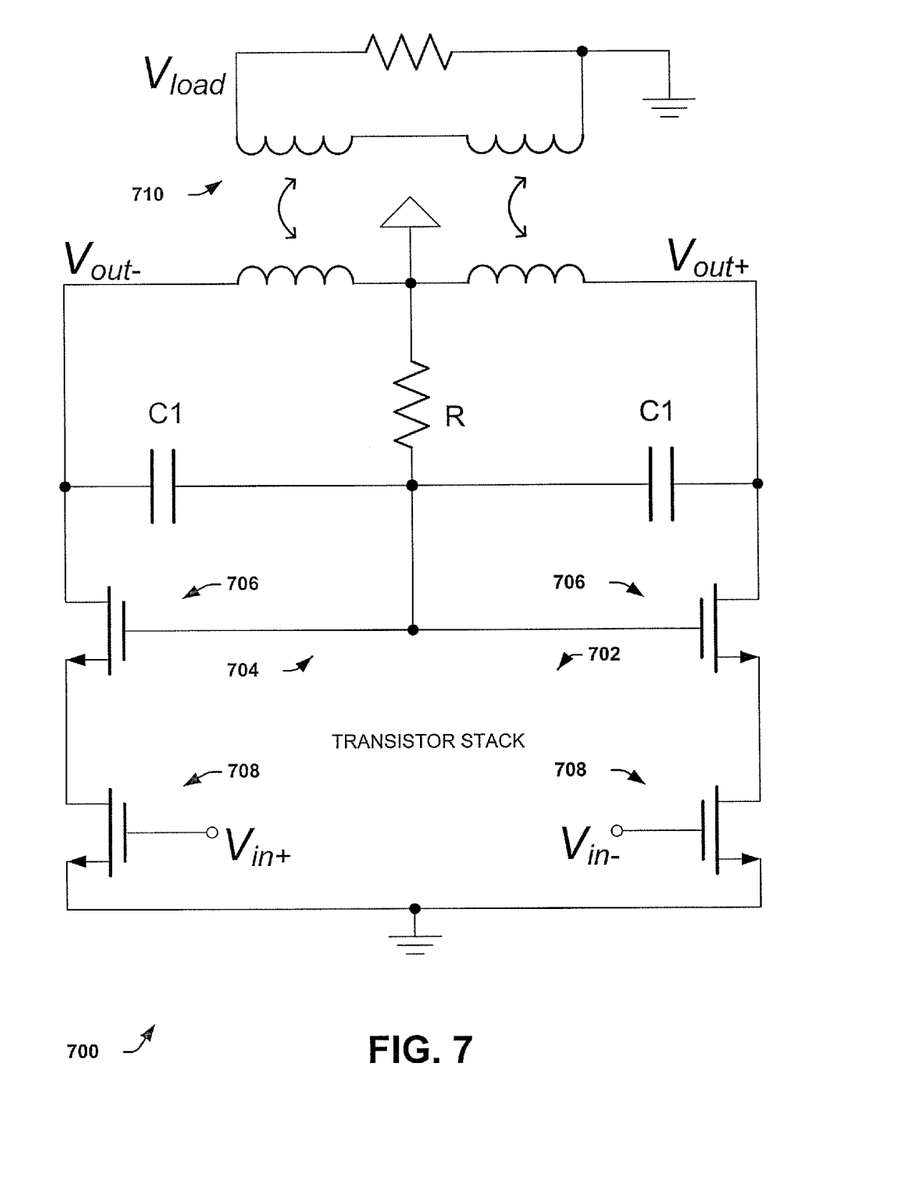
FIG. 7 is a diagram illustrating a power amplifier system having a two transistor stack.

FIG. 7 is a diagram illustrating a power amplifier system 700. The system 700 includes a lower portion 702 and an upper portion 704. The system 700 is a particular case of system 200 and 600, described above, wherein C3=infinity. As a result, FIG. 2 and system 200 and FIG. 6 and system 600 can be referenced to facilitate understanding.

The lower portion 702 includes input transistors 708. The input transistors 708 are configured to receive a differential input signal designated by $V_{in+}$ and The upper portion 704 includes upper transistors 706 and an LC circuit or tank. The upper portion 704 is configured to provide a differential output signal designated by $V_{out+}$ and $V_{out-}$. A load 710 is shown coupled to outputs of the upper portion 704. A transistor stack includes the input transistors 708 and the upper transistors 706, also referred to as output transistors. The LC tank is configured to feed selected harmonics to gates of the transistors stack, in particular the upper transistors 706.

Figure 8:
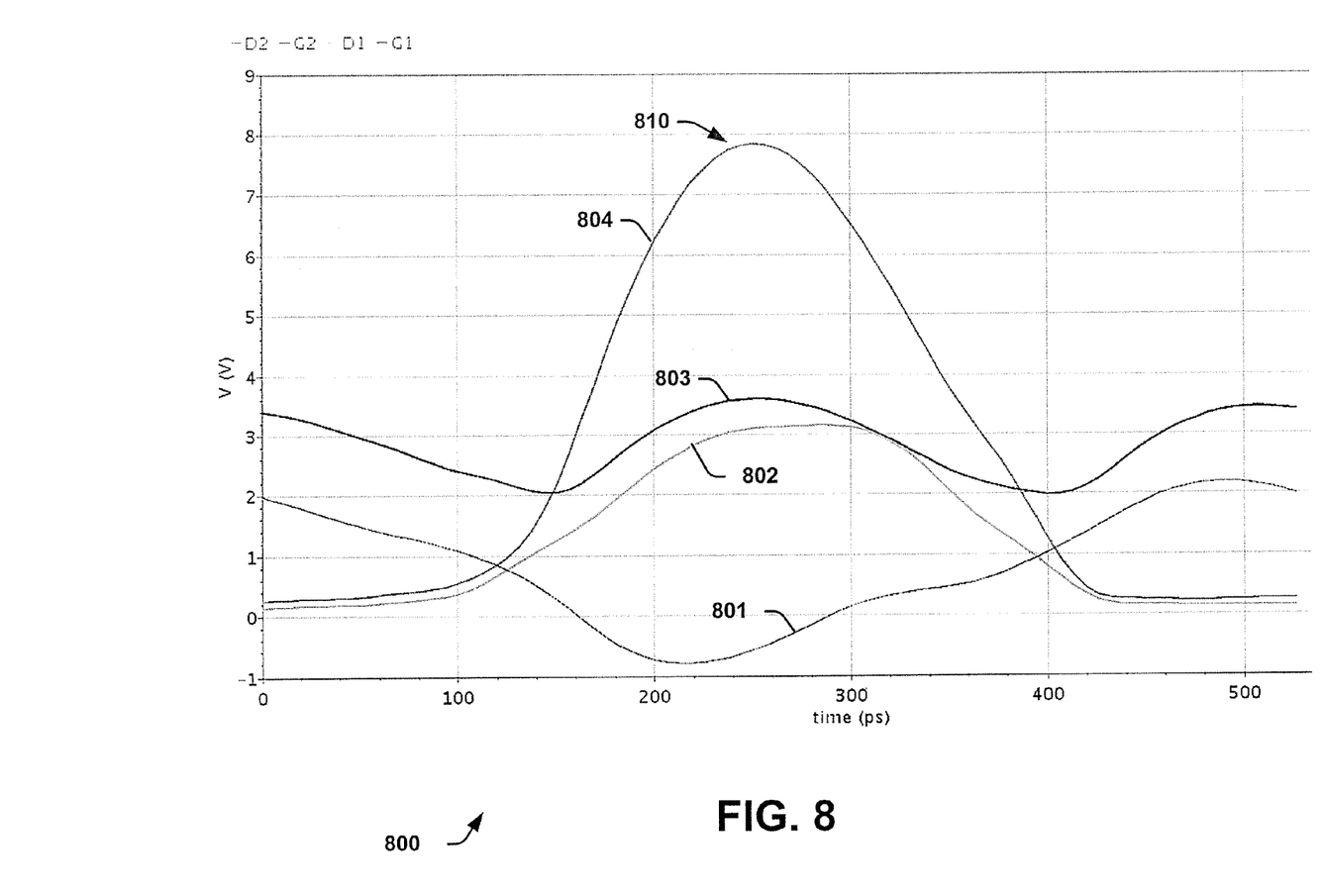
FIG. 8 is a graph illustrating voltage waveforms for a power amplifier having a two transistor stack.

FIG. 8 is a graph illustrating voltage waveforms 800 for the amplifier system 700 of FIG. 7. The waveforms 800 are provided as examples to facilitate understanding. It is appreciated that varied waveforms and voltage values can result. The waveforms are provided for an example configuration of the LC tank.

The graph includes an x-axis showing time (ps) and a y-axis shown Voltage (V). The graph covers the left part or side of the stack; the right part has the same waveforms, just shifted by half-period. Line 801 represents an input signal (Vin+) or (VG1) at gates of the input transistors 708. Line 802 represents a drain voltage/signal (VD1) at the drains of the input transistor 708. Line 803 represents a gate voltage (VG2) at the upper transistor 706. Line 804 represents a drain voltage (VD2) at the upper transistor 708, also referred to as the output signal (Vout-).

In one example LC tank configuration, the load 710 is at about 50 ohm. R is configured to have a resistance value from 100 to 1000 Ohm and C is configured to have a capacitance from 2 to 20 pF. The values of the components depend on the system specifications and on the used technology. These ranges of values intend to cover typical values for power amplifiers in cellular phone transmitters and should be regarded as exemplary.

In this example, the gate voltage 803 of the upper transistor 706 follow a common mode output voltage of drain voltage 804 of the upper transistor 706. Only the fundamental and second order harmonics are relevant. Third and higher order harmonics are highly attenuated.

The output voltage of the stack (or output signal) 804 swings from 0 to 2(Vdd+V2), where V2 is an amplitude of the common mode component of the output signal. At a positive peak 810, voltage stress is at a maximum. At the positive peak 810, the output signal 804 is at 2(Vdd+V2) and the gate voltage 803 of the upper transistor 706 is Vdd+V2, and the drain voltage 802 of the input transistor 708 is VG2-Vth, which equals Vdd+V2-Vth, where Vth is the threshold voltage of the upper transistor 706. The drain to source voltages of the upper and input transistors 706 and 708 are Vdd+V2+Vth for the upper transistor 706 and Vdd+V2-Vth for the input transistor 708. Thus, the voltage stress is not equally distributed by the upper and input transistors 706 and 708. However, the upper transistor 706 can be selected with a longer channel length and the input transistor can be selected as faster to take advantage of this variation, while mitigating voltage stress.

Figure 9:
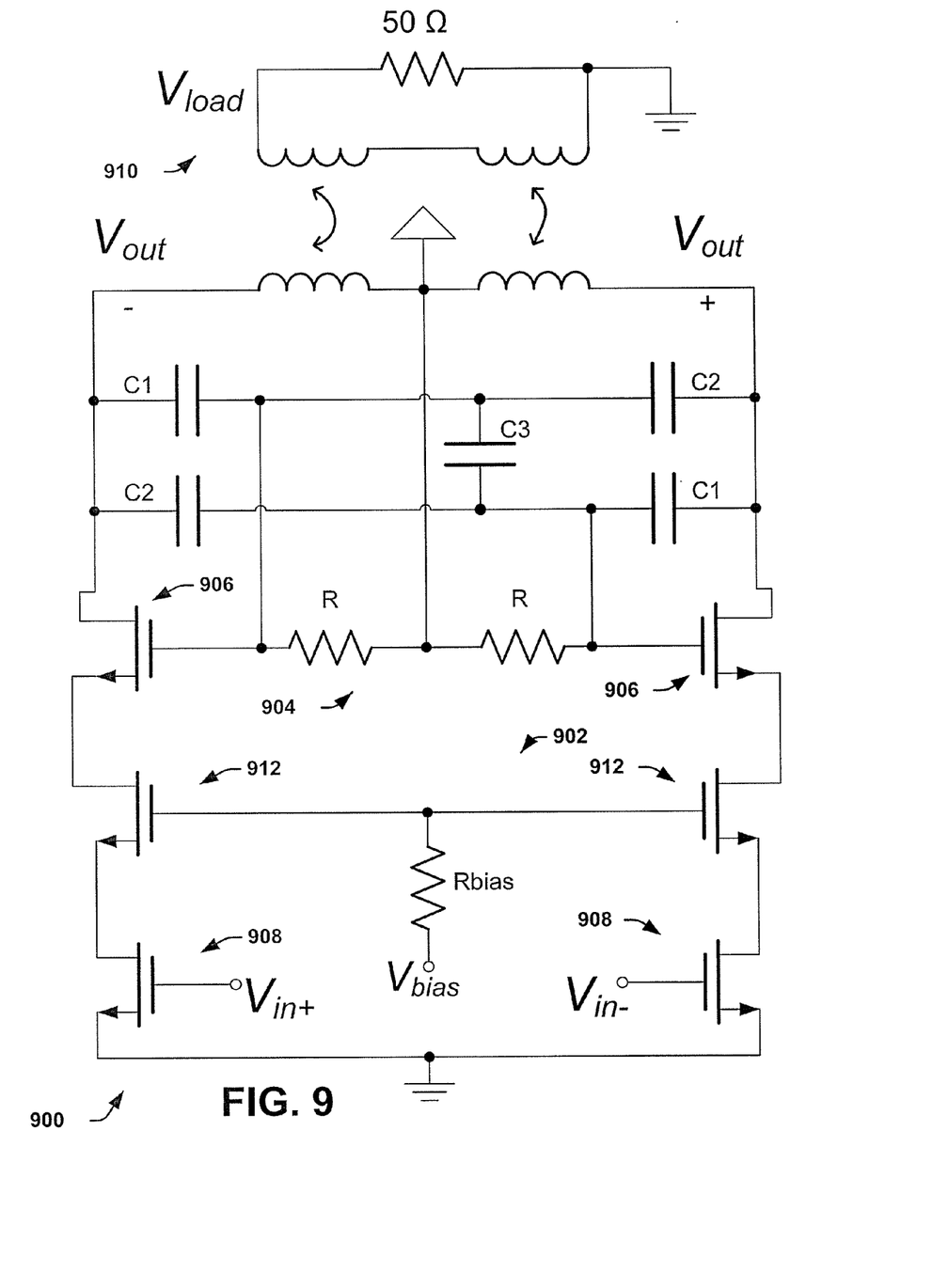
FIG. 9 is a diagram illustrating a power amplifier system having a three transistor stack.

FIG. 9 is a diagram illustrating a power amplifier system 900. The system 900 includes a lower portion 902 and an upper portion 904. The system 900 is a particular case of system 200, described above. As a result, FIG. 2 and system 200 can be referenced to facilitate understanding and for additional description.

The lower portion 902 includes input transistors 908 and gate connected transistors 912. The input transistors 908 are configured to receive a differential input signal designated by $V_{in+}$ and $V_{in-}$. The upper portion 904 includes upper transistors 906 and an LC circuit or tank. The upper portion 904 is configured to provide a differential output signal designated by $V_{out+}$ and $V_{out-}$. A load 910 is shown coupled to outputs of the upper portion 904. A transistor stack includes the input transistors 908, the gate connected transistors 912 and the upper transistors 906. The upper transistors 906 are also referred to as output transistors. The LC tank is configured to feed selected harmonics to gates of the transistors stack, in particular the upper transistors 906.

Figure 10:
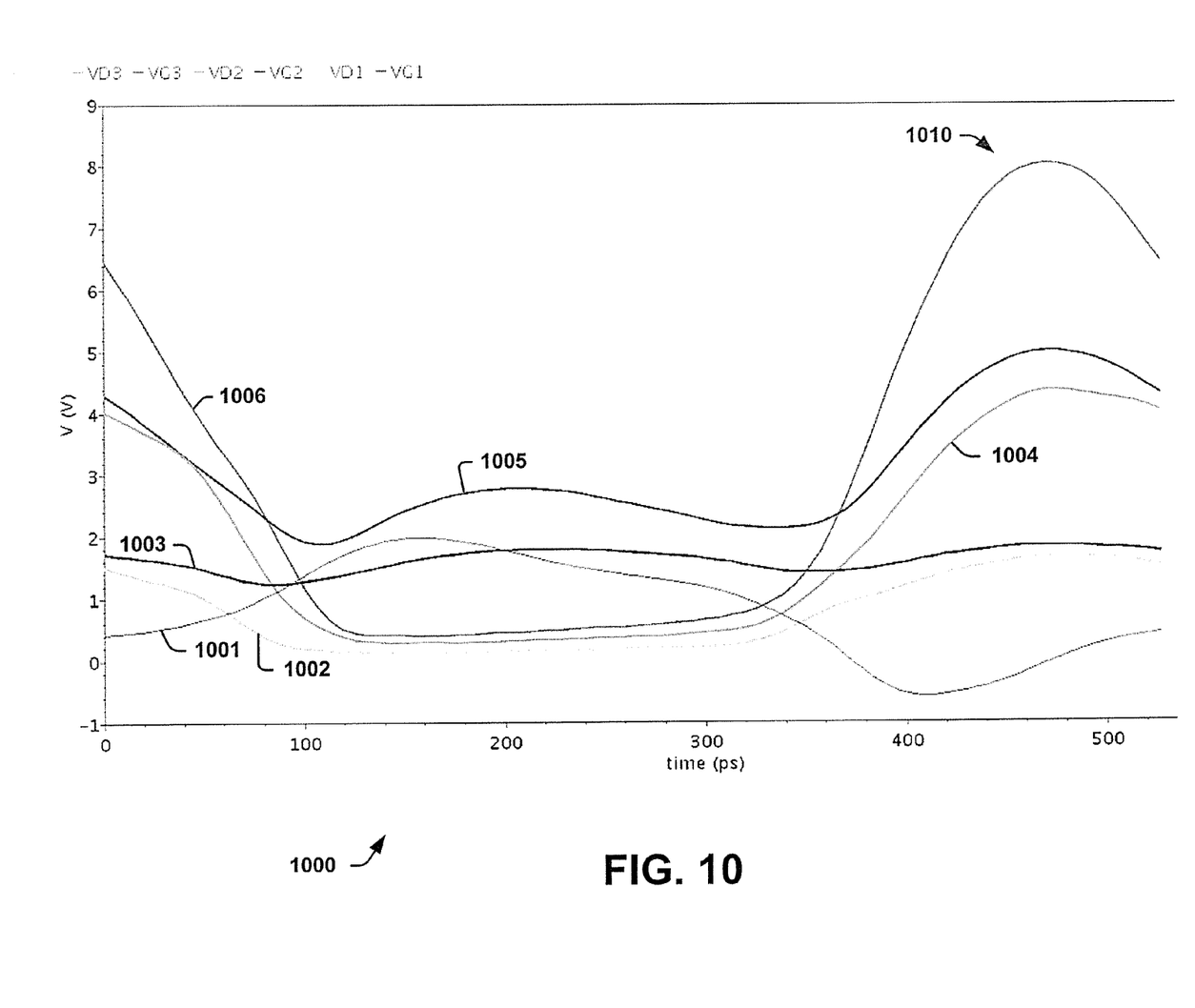
FIG. 10 is a graph illustrating voltage waveforms for a power amplifier having a three transistor stack.

FIG. 10 is a graph illustrating voltage waveforms 1000 for the amplifier system 900 of FIG. 9. The waveforms are provided as examples to facilitate understanding. It is appreciated that varied waveforms and voltage values can result, The graph includes an x-axis showing time (ps) and a y-axis shown Voltage (V). The graph considers only the left part of the stack of FIG. 9; the right part has the same waveforms, just shifted by half-period. Line 1001 represents an input voltage (Vin+) or (VG1) at the input transistor 908. Line 1002 represents a drain voltage (VD1) at the input transistor 908. Line 1003 represents a gate voltage (VG2) at the middle or gate connected transistor 912. Line 1004 represents a drain voltage (VD2) at the gate connected transistor 912. Line 1005 represents a gate voltage (VG3) at the upper or output transistor 906. Line 1006 represents a drain voltage (VD3) at the upper transistor 906. VD3 also represents the output signal (vout−).

In one example LC tank configuration, the load 910 is at about 50 ohm. R is configured to have a resistance value from 200 to 2000 ohm. C3 is configured to have a capacitance value from 0.1 to 10 pF. C1 and C2 are set equal and are configured to have a capacitance value from 1 to 10 pF. C3 is generally smaller than C1 or C2, as described above.

The output signal 1006 (VD3) is shown with a peak at 1010. The peak 1010 represents the maximum voltage stress. This LC tank configuration allows some differential voltage swing 1005 at the gates of the upper transistors 906, yet the gate voltages still follow a common mode output voltage at the drains 1006 of the upper transistors. This decreases the voltage stress at the upper transistors 906. The gate voltage 1003 at gates of the gate connected transistors 912 are differentially grounded and common mode floating for RF signals. The gate voltages 1001 and 1003 of the input transistors 908 and the gate connected transistors 912, accordingly, show that collectively, the transistors 908 and 912 can endure a higher voltage stress than the single, input transistor 708 of FIG. 7.

Figure 11:
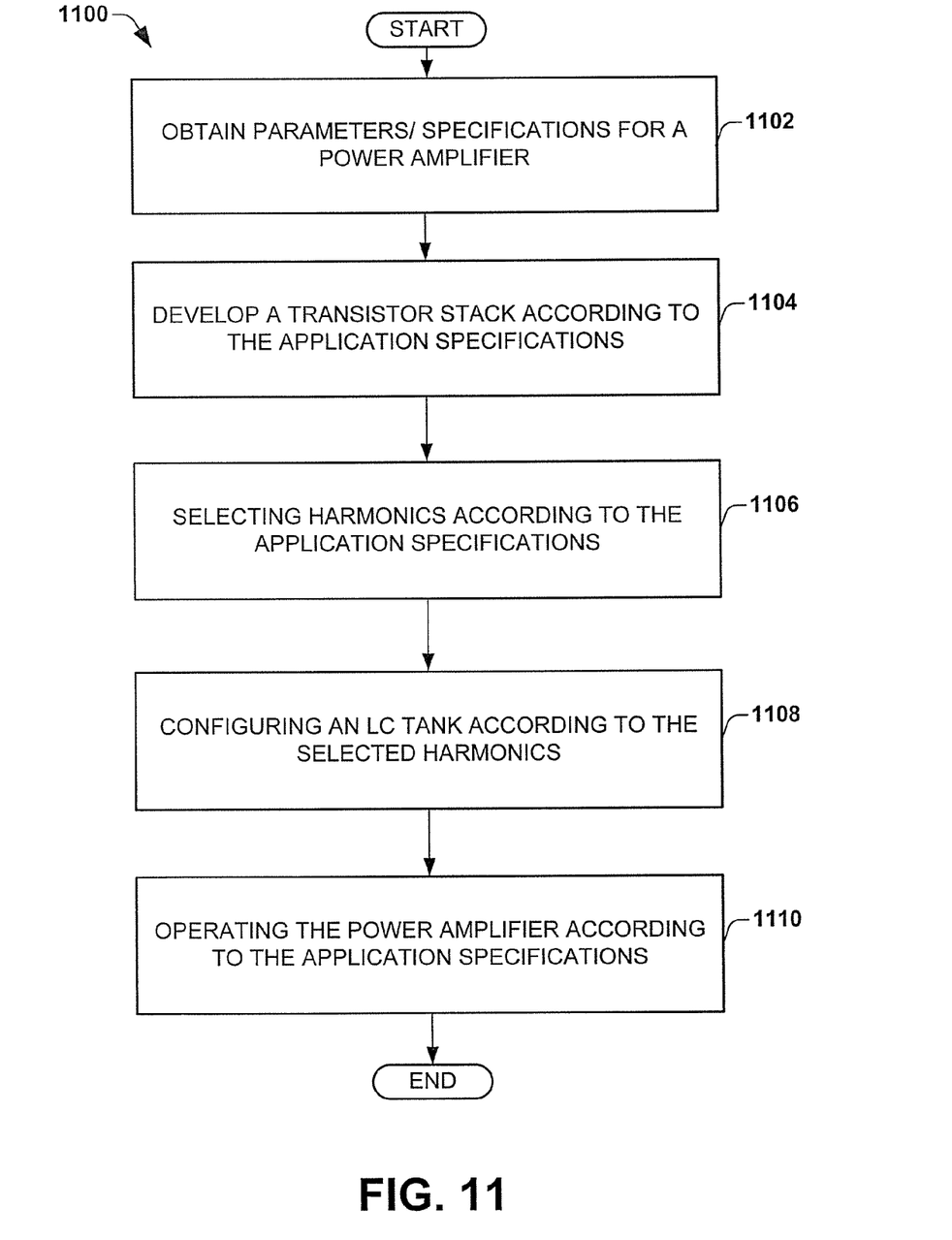
FIG. 11 is a flow diagram illustrating a method of configuring and operating a power amplifier system.

FIG. 11 is a flow diagram illustrating a method 1100 of configuring and operating a power amplifier system. The method 1100 mitigates voltage swings and stresses to facilitate operation of the power amplifier system.

The method begins at block 1102, wherein parameters or specifications for a power amplifier system are obtained. The parameters include applied voltages, voltage swings, maximum voltage stresses, allowed voltage stress per individual transistor, voltage swings, and the like.

A transistor stack is developed or configured at block 1104 according to the parameters/specifications. The transistor stack is developed to have a suitable number of transistors gate connected in series so as to lower a voltage stress on individual transistors of the transistor stack. In one example, the stack includes sets of transistors connected in series, such as is shown in FIG. 9. The transistor stack can include one or more of the following, input transistors, gate connected transistors, output transistors, and the like.

Harmonics are selected according to the parameters/specifications at block 1106. The selected harmonics include an even order harmonic (usually the $2^{nd}$ order harmonic) and can also include an odd order harmonic (usually the fundamental). An even order harmonic is selected for the transistor stack to mitigate voltage stresses on at least a portion of the transistors of the stack. In one example, the harmonics are selected to mitigate voltages stress at gates of output transistors.

An LC tank is configured according to the selected harmonics at block 1108. Thus, the number, configuration, and values of capacitors and inductors in the LC tank are determined to provide common mode path and differential mode path transfer functions. The description above, including system 200 and FIG. 2, illustrate examples of dimensioning or configuring the LC tank to obtain the selected harmonics. Thus, the LC tank is configured according to meet the parameters/specifications.

The power amplifier system is operating at block 1110 within the specified parameters or specifications. For example, the transistors within the stack are subject to a range or swing of voltage levels below a threshold value. The swing of voltage levels is referred to as voltage stress.

While the above method 1100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

A power amplifier system includes a transistor stack and an upper portion. The upper portion includes an LC tank. The LC tank is configured to generate selected harmonics to mitigate voltage stress and facilitate amplifier efficiency. The transistor stack includes serial connected input transistors and upper transistors. The input transistors are configured to receive an input signal and the upper transistors are configured to provide an amplifier output signal. The LC tank is configured to provide the selected harmonics to at least gates of the upper transistors.

A differential power amplifier system has a transistor stack and an upper portion. The transistor stack is configured to receive a differential input signal and to provide a stack output. The transistor stack is subjected to a stack voltage stress. The upper portion is configured to generate a differential amplifier output signal from the stack output. The upper portion includes an LC tank configured to generate the fundamental harmonic, which contains the output signal, but also to generate even harmonics (such as the $2^{nd}$ order harmonic) which are fed to the gates of the stacked transistors, in order to mitigate the voltage stress. The system also includes a common mode path and a differential mode path. The common mode path has a common mode transfer function. The differential mode path has a differential transfer function varied from the common mode transfer function.

A method of configuring a power amplifier system is disclosed. A transistor stack is configured to mitigate stress. Harmonics are selected to further mitigate the voltage stress. The selected harmonics include an even order harmonic. An LC tank is configured to generate the selected harmonics and provide varied transfer functions for common mode and differential mode paths. The selected harmonics are provided to gates of upper transistors of the transistor stack.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A power amplifier system comprising: an upper portion having an LC tank, wherein the LC tank is configured to generate selected harmonics to mitigate voltage stress and facilitate amplifier efficiency;
a transistor stack having serial connected input transistors and upper transistors, wherein the input transistors are configured to receive an input signal and the upper transistors are configured to provide an output signal; and
wherein the LC tank is configured to provide the selected harmonics to at least gates of the upper transistors to mitigate the voltage stress.

2. The system of claim 1, wherein the selected harmonics include an even order harmonic.

3. The system of claim 1, wherein the selected harmonics consist of only one or more even order harmonics.

4. The system of claim 1, further comprising common mode and differential mode paths for the upper portion and the transistor stack.

5. The system of claim 4, wherein the common mode path has a common mode transfer function and the differential mode path has a differential mode transfer function.

6. The system of claim 5, wherein the LC tank is configured so that the common mode transfer function is varied from the differential mode transfer function.

7. The system of claim 1, wherein the selected harmonics cause the gate voltage of each upper transistor to be relatively high when its drain voltage is high.

8. The system of claim 7, wherein the selected harmonics cause the gate voltage of each upper transistor to be relatively high when its drain voltage is low.

9. The system of claim 8, wherein a fundamental harmonic is provided as part of the selected harmonics, with attenuation, to the gates of the upper transistors, causing the gate voltage to be higher when the corresponding drain voltage is high than when the drain voltage is low.

10. The system of claim 1, wherein the selected harmonics are generated to control a differential gate voltage swing of the upper transistors without altering the resonance frequency of the LC tank.

11. The system of claim 1, wherein the selected harmonics are generated to control a common-mode gate voltage swing of the upper transistors without altering the resonance frequency of the LC tank.

12. The system of claim 1, wherein the LC tank is configured to resonate at a fundamental harmonic for a differential mode path and at an even order harmonic for a common mode path in order to generate the selected harmonics.

13. The system of claim 1, wherein the transistor stack further has one or more gate connected transistors connected between the input transistors and the upper transistors to further mitigate the voltage stress.

14. The system of claim 1, wherein gates of the upper transistors are configured to follow the common-mode voltage of the output signal at drains of the upper transistors.

15. A differential power amplifier system comprising: a transistor stack configured to receive a differential input signal and provide a stack output, wherein the transistor stack is subjected to a voltage stress; an upper portion configured to generate selected harmonics and to provide the selected harmonics to the transistor stack to mitigate the voltage stress; a common mode path of the transistor stack having a common mode transfer function; and a differential mode path of the transistor stack having a differential mode transfer function varied from the common mode transfer function.

16. The system of claim 13, the selected harmonics include an even order harmonic.

17. The system of claim 13, wherein the upper portion comprises an LC tank having a first pair of differential connected capacitors coupled to a first output of the stack output and a second pair of differential connected capacitors coupled to a second output of the stack output.

18. The system of claim 17, further comprising a third capacitor coupled to the first and second pairs of capacitors.

19. The system of claim 18, wherein the first pair of capacitors, the second pair of capacitors, and the third capacitor are dimensioned to configure the common mode transfer function and the differential mode transfer function.

20. A method of configuring a power amplifier system, the method comprising: configuring a transistor stack to mitigate voltage stress, the transistor stack including upper transistors; selecting harmonics to further mitigate the voltage stress, the selected harmonics including an even order harmonic; configuring an LC tank to generate the selected harmonics and provide varied transfer functions for common mode and differential mode paths; and providing the selected harmonics to gates of the upper transistors to mitigate the voltage stress.

21. The method of claim 20, wherein the transistor stack includes a plurality of transistors in common-gate connections.

22. The method of claim 20, further comprising generating an amplifier output at drains of the upper transistors.

* * * * *